United States Patent [19]
Havens

[11] Patent Number: 4,591,806
[45] Date of Patent: May 27, 1986

[54] DIELECTRIC RESONATOR STABILIZED OSCILLATOR AND METHOD FOR OPTIMIZING THE OPERATING CHARACTERISTICS THEREOF

[76] Inventor: Richard C. Havens, 8626 E. Roma Ave., Scottsdale, Ariz. 85251

[21] Appl. No.: 627,056

[22] Filed: Jul. 2, 1984

[51] Int. Cl.⁴ .............................................. H03B 5/38
[52] U.S. Cl. .................. 331/96; 331/107 DP
[58] Field of Search ................... 331/90, 96, 107 DP; 333/223, 231

[56] References Cited
FOREIGN PATENT DOCUMENTS
138305 10/1981 Japan ..................................... 331/96

OTHER PUBLICATIONS
George Pate et al., "Say Hello to the DSO" Microwaves, May 1981.
T. Makino et al., "A Highly Stabilized MIC Gunn Oscillator Using a Dielectric Resonator" IEEE, Jul. 1979.
O. Ishihara, "A Highly Stabilized GaAs FET Oscillator" Using a Dielectric Resonator Feedback Circuit in 9-14 GHz" IEEE, Aug. 1980.

Primary Examiner—Eugene LaRoche
Assistant Examiner—G. Wan

[57] ABSTRACT

A dielectric resonator stabilized oscillator structure and method for adjusting the oscillating characteristics of the oscillator which includes mounting the dielectric resonator to a cover housing member which can be positionally varied to move the resonator in a plane parallel to a semiconductor device and transmission line circuitry comprising the oscillator. The semiconductor device and transmission line circuitry are disposed within a bottom housing assembly to which the cover housing member is fixedly mounted to after adjustment and optimizing of the oscillator characteristics is conducted. The cover member includes openings therethrough which are oversized with respect to corresponding threaded openings in the bottom housing assembly thereby allowing the adjustment of the dielectric resonator by moving the cover member while screws are threaded through the openings thereof into the bottom assembly and also fixedly mounting of the cover member to the bottom assembly.

9 Claims, 5 Drawing Figures

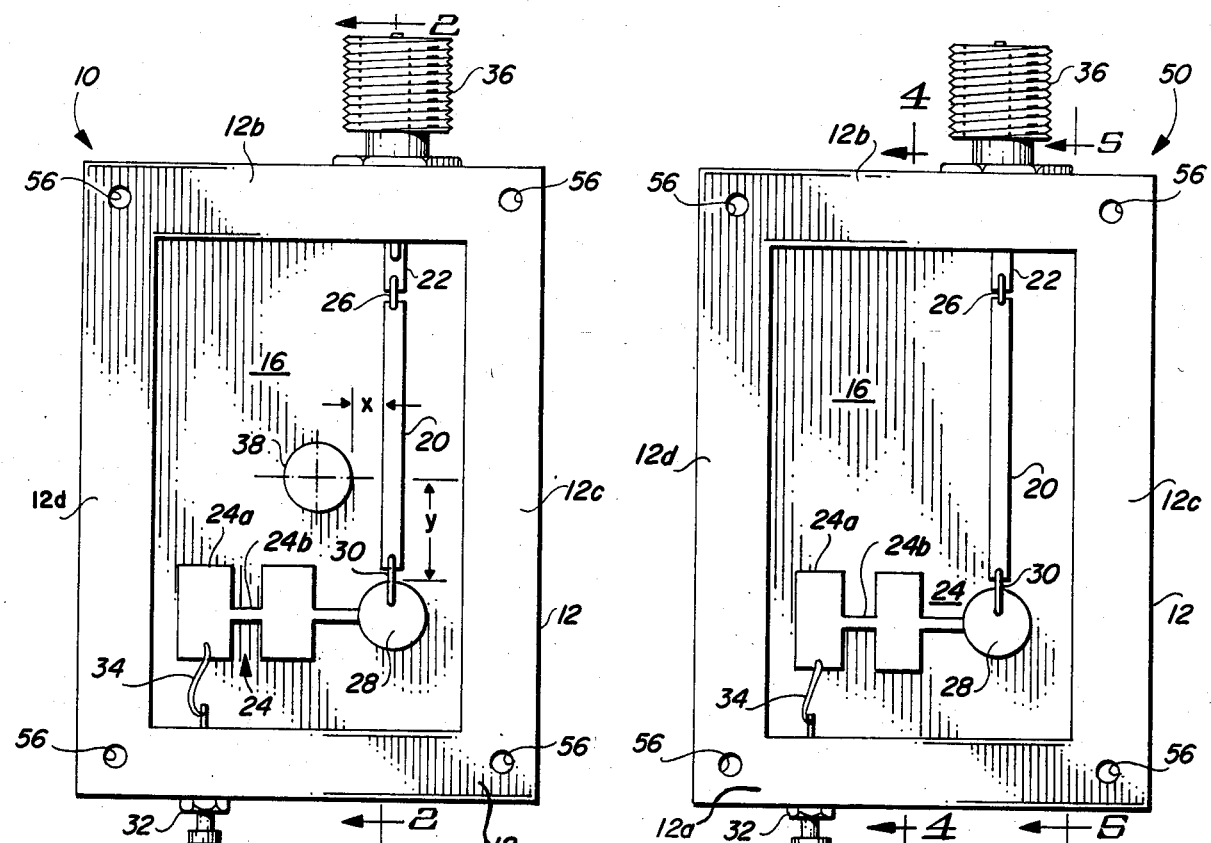
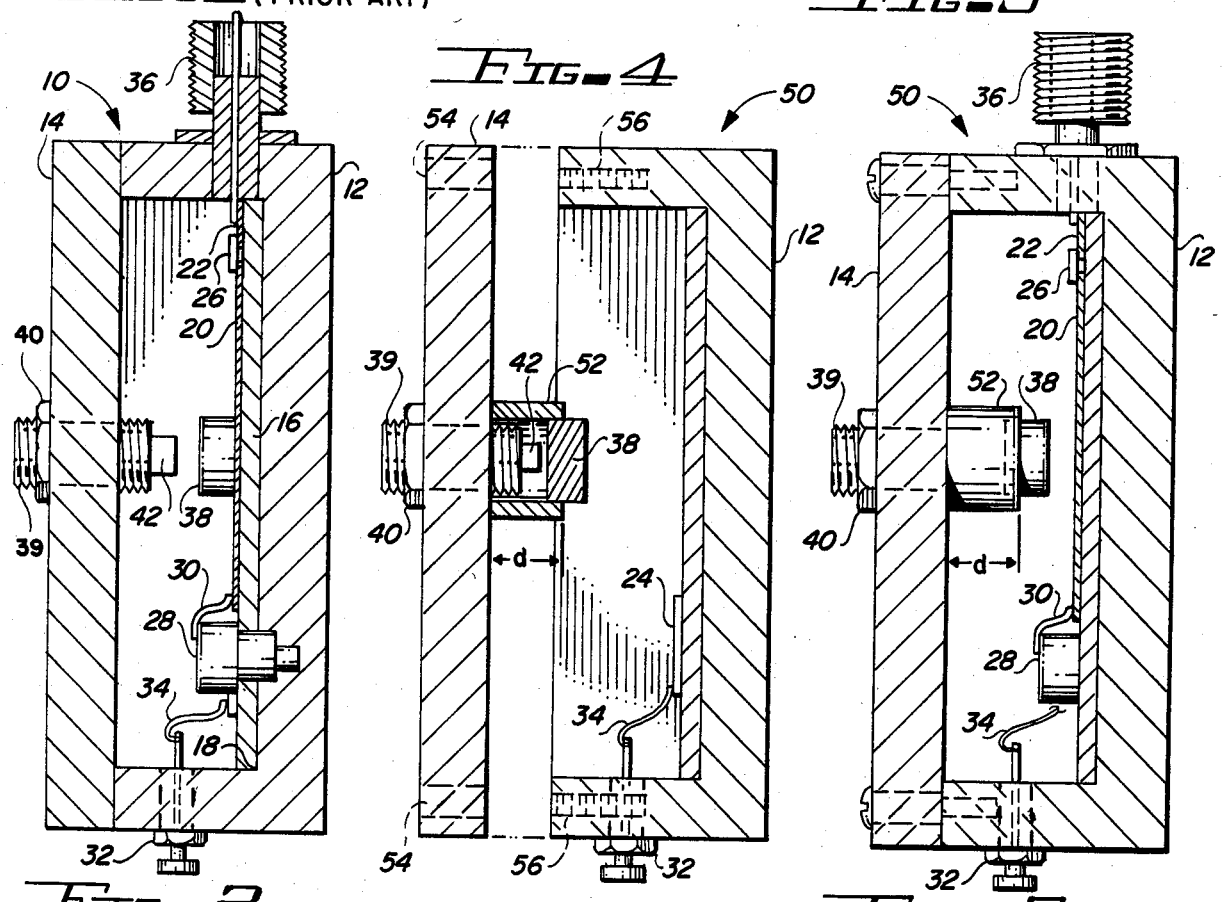

DIELECTRIC RESONATOR STABILIZED OSCILLATOR AND METHOD FOR OPTIMIZING THE OPERATING CHARACTERISTICS THEREOF

BACKGROUND OF THE INVENTION

The present invention relates to oscillators and, more particularly, to high frequency dielectric resonator stabilized oscillators incorporating dielectric resonator discs, cylinders, stabs, etc. for determining the resonant frequency of the oscillator.

In the past, one method of constructing high frequency oscillators has been to utilize Gunn diodes and microwave transistors mounted in various transmission line resonators. However, such transmission line resonator oscillators have poor temperature stability because of the temperature dependence of the semiconductor devices used in the construction thereof, the poor temperature sensitivity of the transmission line mediums and the low quality (Q) factor of the transmission line resonators. Furthermore, the sensitivity of the oscillator to the difference in device semiconductor characteristics from one semiconductor device to the next and the sensitivity to the transmission line resonator dimensions has made such transmission line resonator oscillators expensive to mass produce since very close tolerances are required for the transmission line resonator parts and the semiconductor device characteristics. Because of the low Q of the transmission line resonators, the oscillator frequency stability, FM noise, pushing, pulling and other characteristics are not as good as required for many applications. Hence, a less expensive and better performing fundamental resonator oscillator is needed.

In recent years, dielectric resonators of high dielectric constant ($E_r = 3_8$ is typical), low-loss and high temperature stability have been developed to allow high frequency transistors and Gunn diode transmission line oscillators to be designed with a dielectric resonator which have high frequency stability, high Q, small size and low noise performance. The small size, simple construction and moderate bias requirements of these dielectrically stabilized oscillators give them important advantages over the aforementioned transmission line resonator oscillators as well as other cavity resonators and crystal-controlled multiplier chain types of oscillators.

Typically, commercially available dielectric resonator stabilized oscillators consist of a transistor, Gunn or Impatt diode oscillator locked to some resonant frequency by a resonant disc of dielectric material. The disc is coupled to a microstrip line or lines to provide the necessary positive feedback for oscillation. One type of such disc commercially available is made of Barium Tetratitanate material.

Contemporary dielectric resonator stabilized oscillators (DRSOs) which have been sold for about the last five years are constructed by mounting the usually cylindrical shaped disc resonator on a microstrip substrate comprising the microstrip circuitry (microstrip being one type of transmission line) to which the disc resonator is electro-magnetically coupled. For optimum oscillator characteristics the disk resonator must be located adjacent the transmission line or microstrip line to provide the proper positive feedback and impedance match to the circuitry and semiconductor device. Thus, present day methods of mounting the disc resonator to the microstrip substrate is undesirable for commercial production as it requires extremely precise circuit and semiconductor device tolerances to achieve optimum performance or expensive tuning means such as adjustments in the microstrip circuitry to correct for misplacement of the disc resonator. The disc can be easily misaligned as it must typically be within 0.001 inches in both the x and y dimensions of the microstrip line to provide optimum results in most microwave circuits. This increases the production costs which is undesirable and does not allow easy adjustable tuning from oscillator to oscillator to compensate for device and production tolerance differences.

Thus, a need exists for permitting optimization of the operating characteristics of DRSOs in production assembly while minimizing operator time for optimizing these characteristics.

SUMMARY OF THE INVENTION

Accordingly, it is an object of the present invention to provide an improved dielectric resonator stabilized oscillator (DRSO).

It is another object of the present invention to provide an improved DRSO and method for optimizing the characteristics thereof.

It is still another object of the present invention to provide a DRSO and method for optimizing the oscillator characteristics by having the dielectric resonator thereof moveably mounted within the oscillator structure.

In accordance with the above and other objects, there is provided a DRSO and method for optimizing the oscillator characteristics comprising an oscillator housing in which is mounted a transmission line consisting of a transmission line circuit to which a semiconductor device is connected and including a dielectric disc resonator electromagnetically coupled to the transmission line circuit, wherein there is provided means for mounting the disc resonator to a cover with said cover being moveably mounted with respect to a housing member of the oscillator housing such that the physical location of the disc resonator is moveable with respect to the transmission line of the transmission line circuitry to which said disc resonator is electromagnetically coupled.

BRIEF DESCRIPTION OF THE DRAWINGS

FIG. 1 is a top elevation view of a conventional DRSO and housing assembly with the housing top member removed;

FIG. 2 is a longitudinal cross-sectional view of the DRSO of FIG. 1;

FIG. 3 is a top elevational view showing the DRSO and housing assembly of the preferred embodiment with the top housing member removed;

FIG. 4 is an exploded cross-sectional view of the DRSO of FIG. 3 taken in the direction of arrows 4—4; and FIG. 5 is a cross-sectional view of the assembled DRSO of the present invention.

DETAILED DESCRIPTION OF THE PREFERRED EMBODIMENT

Turning to FIGS. 1 and 2, there is illustrated DRSO 10 that is conventional in its structure and which the operation thereof is well known to those skilled in the art. DRSO 10 is assembled in a metallic housing comprising bottom housing member 12 and top housing member 14. Bottom housing member 12 may be fabricated by machining or die casting techniques thereby forming end and side wall members 12a, 12b, 12c and 12d to which top housing member 14 is mounted using conventional mounting techniques. A dielectric substrate 16 is fabricated to fit within bottom housing member 12 along bottom planar surface 18 thereby making ground and heat sink contact thereto. Substrate 16 typically is plated of conductive material on both sides with the upper surface thereof being etched to selectively pattern the transmission line or microstrip circuitry comprising microstrip conductors 20, 22 and 24. Microstrip conductors 20 and 22 may have a characterisitc impedance of 50 ohms and are AC coupled to each other by capacitor 26. Conductor 24 may be of high impedance at the resonant frequency of DRSO 10 or may be, as shown, an RF filter constructed of alternating low and high impedance sections 24a and 24b respectively as is understood.

A semiconductor device 28 is provided that has one electrode contacting microstrip conductor 24 and microstrip conductor 20 via conductor strap 30. Semiconductor device 28 may be recessed into housing 12 such that the other electrode makes ground contact therewith. Housing 12 may also acts as a heat sink for the oscillator. As illustrated, semiconductor device 28 is a Gunn diode. However, any appropriate type of semiconductor device, such as a GaAs field effect transistor (FET) or Impatt diode, may be utilized.

DC bias is applied to DRSO 10 through feedthrough connector 32 which is contacted to microstrip conductor 24 by lead 34. The output of DRSO 10 is coupled through output connector 36 to a load (not shown) as the connector is electrically connected to microstrip conductor 22. A cylindrical dielectric disc resonator 38 is mounted to substrate 16 which among other properties, determines the basic resonant frequency of DRSO 10. A commercially available microwave tuning element 39 consisting of mounting bushing lock assembly 40 and integral tuning rotor 42 allows mechanical tuning of the oscillator frequency as the spacing between tuning rotor 42 and disc resonator 38 is varied by threading of tuning rotor 42.

The operation of DRSO 10 is well understood by those skilled in the art and is therefore only briefly discussed hereinafter. Disc resonator 38 acts as a high Q resonator that is electro-magnetically coupled to microstrip conductor 20 to provide an equivalent parallel resonant circuit in series with microstrip conductor 20. By varying the spacing between disc resonator 38, conductor 20 and semiconductor device 28 the oscillating characteristics of DRSO 10 can be optimized. For example, by varying the distance x between the edge of disc resonator 38 and conductor 20 as well as the distance y between the center position of resonator 38 and the reference plane of semiconductor device 28, the oscillator frequency, output power, oscillator Q, and FM noise characteristics of DRSO 10 are varied. Also, the frequency pushing and pulling characteristics of DRSO 10 are adjusted by varying spacing of resonator 38.

In view of the above it is seen how important the spacing of disc resonator 38 is for maximizing the operating characteristics of DRSO oscillators. In most, if not all, prior art DRSO circuits disc resonator 38 is bonded to the surface of microstrip substrate 16 after optimizing the distance there between with conductor 20 and semiconductor device 28. Thereafter top cover 14 is then assembled. Because each semiconductor device characteristics are different and, due to machining or etching production tolerances, each DRSO of the prior art requires extremely close tolerances or individual tuning before disk resonator 38 is bonded to substrate 16. Once resonator 38 is bonded, it is not readily removeable. Thus, the prior art systems do not allow for fine tuning of the resonator position to optimize the oscillator characteristics once resonator 38 is bonded to substrate 16 to accommodate production tolerances as previously described. In addition, if for any reason the semiconductor device must be replaced the prior art circuit techniques do not allow retuning of the resonator position due to resonator 38 being bonded to substrate 16. Hence, prior art DRSOs are expensive to mass produce which is a significant drawback to the use thereof in spite of the fact that DRSOs are small in size and have important advantages over other types of microwave frequency oscillators.

Turning now to FIGS 3–5, there is shown DRSO 50 of the preferred embodiment which allows fine tuning to optomize the oscillating characteristics of the oscillator that is suited for commercial production assembly techniques. It is understood that the basic construction and operation of DRSO 50 is similar to DRSO 10 illustrated in FIGS. 1 and 2 and, therefore, like components are designated by the same reference numerals. As illustrated, disc resonator 38 is mounted to top housing member 14 by mounting assembly 52. Mounting assembly 52 may be made of any suitable low loss dielectric material such as ceramics. It is desireable to make support 52 of a low loss microwave material and to remove or "isolate" the dielectric resonator 38 as far away from other metals and the dielectric substrate 16 as is possible in order to not degrade the Q of dielectric resonator 38 and, hence, the performance of the oscillator. In the preferred embodiment mounting assembly 52 consist of a hollow cylinder of Rexolite 1422 material, where Rexolite is a trade name of the dielectric material utilized and is manufactured by Oak Industries. If mounting assembly 52 is made of ceramic it is mounted to the bottom surface of top housing member 14 using inert bonding material such as ceramic or glass bonding material, for example, that may be heated diffusing the same which bonds mounting assembly 52 onto top housing member 14. Using Rexolite, mounting assembly 52 is expoxied to cover 14. Disc resonator 38 is bonded to the bottom of the hollow cylinder comprising mounting assembly 52 with tuning element 39 being mounted through top housing member interiorly of the inner diameter of mounting assembly 52 as shown.

For a particular type of DRSO, for instance, one that uses a Gunn diode as the active semiconductor device 28, the length "d" of mounting assembly 52 is empirically determined for gross output power, oscillator frequency and oscillator Q. Thereafter, fine tuning of the oscillator operating characteristics is obtained by adjusting the spacings x and y of disk resonator 38 with respect to stripline 20 and device 28 as described above. In the preferred embodiment, the spacing of resonator 38 is adjusting by oversizing openings 54 in top housing member 14 with respect to corresponding threaded holes 56. This allows moving of disk resonator in the x and y directions during production assembly to optimize the oscillating characteristic of DRSO 50 prior to fixedly attaching top housing member 14 to bottom member 12. For example, with top housing member loosely attached to bottom housing member 12 by, for instance, by partially threading screws through openings 54 into threaded openings 56, cover 12 can be rotated or moved while the output of DRSO 50 is being monitored in order to obtain the desired oscillating characteristics. This adjusts the spacing of dielectric resonator 38 in relationship to conductor 20 and semiconductor device 28 to compensate for different device characteristics, device spacing with respect to the nominal resonator location circuit etching, conductive strap and machine tolerances. Thereafter, top or cover member 14 is securely threaded to bottom housing 12.

Although what has been described above is a Gunn diode dielectric resonator stabilized oscillator, it is understood that the same optimizing techniques can be utilized with DRSOs incorporating GaAs FETs and other types of high frequency semiconductor devices such as Impatt diode incorporating one or more dielectric resonators.

Again, although what has been described above is a two port negative resistance device with feedback provided by the reflection coefficient of dielectric resonator 38, the same techniques can be utilized with 3 port devices such as FET's where feedback is provided through the dielectric resonator from one transmission line to another transmission line, where one transmission line may be, for example, connected to the drain electrode and the other transmission line connected to the gate electrode.

Moreover, although not specifically illustrated, an O-ring may be utilized in conjunction with a channel formed in the housing assembly accommodating the O-ring for providing a water seal for DRSO 50. The housing assembly may also be provided with hermetic sealing utilizing welding techniques for assembling cover 14 to bottom 12 such welding techniques including, among others, electron beam, arc and laser techniques. In this case holes 54 and threaded holes 56 might not be used at all.

Thus, what has been described is a novel structure and method for optimizing the oscillating characteristics of a dielectric resonator stabilized oscillator for use in development or production assembly of such oscillators. By mounting the dielectric resonator to the removable cover of the housing assembly at a predetermined height above the oscillator transmission line circuitry and making provisions for moving the cover plate while the oscillator is operating the dielectric resonator can be moved in an x-y plane with respect to the transmission line substrate and semiconductor device while the output of the oscillator is monitored to allow adjusting the oscillator output characteristics. Upon optimizing the output characteristics the cover is then tightly attached to the bottom member. Hence, differences in semiconductor device characteristics from one device to the next, in addition to small differences in machine and/or etching tolerances can be accommodated and adjusted therefor during production assembly of the oscillator.

I claim:

1. In a dielectric resonator stablized oscillator including transmission line circuitry disposed within a housing assembly consisting of a first housing member mounted to a second housing member, a semiconductor device mounted to the transmission line circuitry, a dielectric resonator in spatial relationship to the transmission line circuitry and bias means for providing an operating potential to the oscillator, the improvement comprising:

means for mounting the dielectric resonator to the first housing member wherein the dielectric resonator is held in spatial relationship to the transmission line circuitry; and means for permitting movement of said first housing member with respect to the second housing member for adjusting said spatial relationship of the dielectric resonator with respect to the transmission line circuitry whereby the oscillator characteristics are varied as the dielectric resonator is moved, the first housing member being fixedly mounted to the second housing member thereafter.

2. The oscillator of claim 1 wherein said means for permitting movement of said first housing member includes openings disposed therethrough.

3. The oscillator of claim 2 wherein said second housing member includes threaded openings disposed therein corresponding to a particular one of said openings in said first housing member.

4. The oscillator of claim 1 wherein said mounting means is a cylinder of dielectric material attached at a proximal end to the first housing member with the dielectric resonator attached to the distal end of said cylinder such that the dielectric resonator is isolated from the first housing member.

5. The oscillator of claim 4 wherein said cylinder is hollow and is formed of Rexolite dielectric material.

6. The oscillator of claim 5 including tuning element means disposed in said first housing member and having tunable means located interiorly of said hollow cylinder for mechanically tuning the resonant frequency of the oscillator within a predetermined range of oscillation frequencies.

7. In a dielectric resonator stabilized oscillator comprising a first housing assembly and a second housing assembly to which the first housing assembly is mounted, transmission line circuitry disposed within the second housing assembly, a semiconductor device coupled to the transmission line circuitry, and a disc resonator, a method for adjusting the oscillating characteristics of the oscillator comprising the steps of:

mounting the disc resonator to the first housing assembly; and moving the first housing assembly with respect to the second housing assembly prior to fixedly mounting the first housing assembly thereto to vary the spatial relationship of the disc resonator to the transmission line circuitry.

8. In a dielectric resonator stabilized oscillator consisting of a transmission line circuitry disposed in a housing assembly that includes a cover member and a base member, a semiconductor device coupled to the transmission line circuit and bias circuit for supplying an operating potential to the semiconductor device, a method for adjusting the oscillating characteristics of the oscillator, comprising the steps of:

mounting the dielectric resonator a predetermined height above but in spatial relationship to both the transmission line circuit and the semiconductor device;

moving the dielectric resonator with respect to the transmission line circuit while observing the oscillating characteristic of the oscillator.

9. The method of claim 8 including:

mounting the dielectric resonator to the cover member; and moving the cover member with respect to the base member.

* * * * *